United States Patent
Lee et al.

(10) Patent No.: US 7,230,323 B2
(45) Date of Patent: Jun. 12, 2007

(54) GROUND-ENHANCED SEMICONDUCTOR PACKAGE AND LEAD FRAME FOR THE SAME

(75) Inventors: Yi-Shiung Lee, Taichung Hsien (TW); Chun-Yuan Li, Taichung Hsien (TW); Holman Chen, Taichung Hsien (TW); Shih-Tsun Huang, Taichung Hsien (TW); Chih-Yung Yun, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/635,245

(22) Filed: Aug. 5, 2003

(65) Prior Publication Data

US 2004/0238921 A1    Dec. 2, 2004

(30) Foreign Application Priority Data

May 28, 2003  (TW)  ............................... 92114337 A

(51) Int. Cl.
*H01L 23/495*  (2006.01)
*H01L 23/52*  (2006.01)
*H01L 23/04*  (2006.01)

(52) U.S. Cl. .................. 257/670; 257/666; 257/676; 257/691; 257/698

(58) Field of Classification Search ................ 257/666, 257/670, 690, 691, 692, 676, 698
See application file for complete search history.

(56) References Cited

U.S. PATENT DOCUMENTS

| | | | |
|---|---|---|---|
| 5,196,725 A | 3/1993 | Mita et al. ................... | 257/672 |
| 5,237,202 A | 8/1993 | Shimizu et al. ............. | 257/672 |
| 5,293,066 A * | 3/1994 | Tsumura ...................... | 257/668 |
| 5,399,809 A | 3/1995 | Takenouchi ................ | 174/84 R |
| 5,734,198 A | 3/1998 | Stave .......................... | 257/666 |
| 5,777,265 A | 7/1998 | Bhattacharyya et al. ... | 174/52.4 |
| 5,814,877 A | 9/1998 | Diffenderfer et al. ....... | 257/666 |
| 6,326,678 B1 * | 12/2001 | Karnezos et al. ........... | 257/666 |
| 6,380,048 B1 | 4/2002 | Boon et al. .................. | 438/456 |
| 6,437,427 B1 | 8/2002 | Choi ........................... | 257/666 |
| 6,627,977 B1 * | 9/2003 | Foster ......................... | 257/666 |
| 6,630,373 B2 * | 10/2003 | Punzalan et al. ............ | 438/123 |
| 6,713,322 B2 * | 3/2004 | Lee .............................. | 438/123 |
| 2004/0061205 A1 * | 4/2004 | Han et al. .................... | 257/666 |

* cited by examiner

*Primary Examiner*—Sara Crane
*Assistant Examiner*—Samuel A. Gebremariam
(74) *Attorney, Agent, or Firm*—Peter F. Corless; Steven M. Jensen; Edwards Angell Palmer & Dodge LLP

(57) ABSTRACT

A ground-enhanced semiconductor package and a lead frame used in the package are provided. The semiconductor package includes a lead frame having a die pad, a plurality of tie bars connected with and supporting the die pad, a plurality of leads surrounding the die pad, and a ground structure, wherein the ground structure comprises at least one of first ground portions connected to the tie bars, and/or at least one of second ground portions connected to the die pad, and wherein the first ground portions are separate from each other, and the second ground portions are separate from each other; at least one chip mounted on the die pad and electrically connected to the leads and the ground structure; and an encapsulation body for encapsulating the chip and the lead frame. The separately-arranged ground portions allow thermal stresses to be released from the ground structure without rendering deformation issues.

18 Claims, 10 Drawing Sheets

GROUND-ENHANCED SEMICONDUCTOR PACKAGE AND LEAD FRAME FOR THE SAME

FIELD OF THE INVENTION

The present invention relates to ground-enhanced semiconductor packages, and more particularly, to a lead-frame-based semiconductor package which can prevent thermal deformation of ground areas thereof to promote the electricity performance.

BACKGROUND OF THE INVENTION

A conventional semiconductor package, such as Quad Flat Package(QFP) or Quad Flat Non-leaded(QFN) package, uses a lead frame as a chip carrier having a die pad and a plurality of leads, allowing at least one chip to be mounted on the die pad and electrically connected to the leads by a plurality of bonding wires which are bonded to bond pads on a surface of the chip. An encapsulation body is adopted to encapsulate the chip, the lead frame, and the bonding wires to thereby form the semiconductor package. Moreover, the die pad can be made to have one surface thereof exposed to outside of the encapsulation body, and such an exposed-pad type package facilitates dissipation of heat from the chip via the exposed surface of the die pad.

In response to improvement in chip integration, for the sake of enhancing the electricity performance and reducing noise, the semiconductor package is preferably made to provide grounding function for the chip incorporated therein, which can be accomplished by connecting ground wires to the die pad of the lead frame to effect the grounding performance. However, since the ground wires are usually bonded to peripheral areas on the die pad, in the case of delamination occurring between the die pad and the encapsulation body due to mismatch in coefficient of thermal expansion (CTE) thereof, the ground wires tend to break easily and degrade the electricity performance. Such a drawback becomes more severe in an exposed-pad type package where the occurrence of delamination between the die pad and the encapsulation body is increased due to relatively weaker adhesion therebetween.

Accordingly, U.S. Pat. Nos. 5,196,725, 5,237,202, 5,399,809, 5,734,198 and 5,777,265 disclose a semiconductor package using a multi-layer lead frame which is formed with a ground plane, for allowing ground wires to be electrically connected to bond pads on a chip, so as to reduce noise for the chip. However, such a multi-layer lead frame is rather complex in structure which is not material-effective to fabricate, thereby leading to a burden for manufacture and costs of the semiconductor package as well as not in favor of large-scale production.

Therefore, U.S. Pat. No. 5,814,877 provides a single-layer lead frame which is cost-effective and simple to fabricate and not affected by the die-pad delamination problem, wherein a ground ring 62 is formed around a die pad 61 of the lead frame 60 and electrically connected to ground pads on a chip 63, as shown in FIGS. 5A and 5B. Moreover, for an exposed-pad type package, a ground ring can be separate from the die pad and is thus not damaged by the occurrence of delamination between the die pad and the encapsulation body; as shown in FIGS. 6A and 6B, the lead frame 70 taught by U.S. Pat. No. 6,437,427 is formed with a ground ring 73 separate from the die pad 71, such that ground wires 75 not connected to the die pad 71 would not break by delamination of the die pad 71. FIGS. 7A and 7B show another semiconductor package having ground ring according to U.S. Pat. No. 6,380,048, in which a ground ring 82 surrounds the die pad 81 of the lead frame 80 and is connected by S-shaped tie bars 83 to the die pad 81 in a manner that, symmetric hollow-out portions 84 of a predetermined shape are arranged between the die pad 81 and the ground ring 82 and facilitate the release of thermal stresses generated during molding; also, the hollow-out portions 84 are filled by an encapsulation body 85 by which the lead frame 80 is more strongly held in position.

Although the above ground ring desirably simplifies fabrication processes, reduces costs and prevents breaks of ground wires, its continuous ring structure would be easily deformed in a high-temperature condition such as die bond curing, wire bonding and molding processes and reliability tests, as shown in FIGS. 8A and 8B. This thermal deformation is caused by thermal expansion of metallic material making the ground ring which is constrained within or not able to be released from the continuous ring structure, and thereby damages the planarity of the ground ring. The deformed ground ring also increases the difficulty in bonding the ground wires, or the ground wires may subject to breaking by the deformation, making the electricity performance undesirably degraded. Besides, during a stamping process for fabricating the lead frame having the continuous ground ring, the stamping force may be left to form residual stresses in the ground ring, which also leads to deformation of the ring structure under a subsequent high-temperature environment.

In respect of FIGS. 7A and 7B taught by U.S. Pat. No. 6,380,048, although the S-shaped tie bars 83 may release the thermal stresses generated during molding, the released stresses are merely from the S-shaped tie bars 83 which interconnect to the die pad 81 and the ground ring 82. The hollow-out portions 84 provides space for stress release from the tie bars 83 along the directions indicated by arrows shown in FIG. 9A. However, for the ground ring 82 whose periphery is tied by the tie bars 83, the thermal stresses are not allowed to be easily released from the ground ring 82, and as a result, the ground ring 82 would be deformed as shown in FIG. 9B, further causing damage to the electrical connection or breaking g (as circled in FIG. 9C) of ground wires 86. Namely, the provision of the S-shaped tie bars still fails to solve the problem of ground-ring deformation.

Therefore, it is of great interest to develop a ground-enhanced semiconductor package that prevents deformation of ground areas and breaks of ground wires under a high-temperature fabricating condition to ensure the electricity performance thereof.

SUMMARY OF THE INVENTION

An objective of the present invention is to provide a ground-enhanced semiconductor package and a lead frame for the same, which can prevent ground areas thereof from deformation under a high-temperature condition.

Another objective of the present invention is to provide a ground-enhanced semiconductor package and a lead frame for the same, to eliminate difficult bonding of ground wires.

Still another objective of the present invention is to provide a ground-enhanced semiconductor package and a lead frame for the same, to avoid breaking of ground wires.

A further objective of the present invention is to provide a ground-enhanced semiconductor package and a lead frame for the same, in which thermal stresses on ground areas thereof can be released.

A further objective of the present invention is to provide a ground-enhanced semiconductor package and a lead frame for the same, for reducing residual stresses on the lead frame during fabrication processes.

To achieve the above and other objectives, the present invention provides a ground-enhanced semiconductor package, comprising: a lead frame having at least one die pad, a plurality of tie bars connected with and supporting the die pad, a plurality of leads surrounding the die pad, and a ground structure, wherein the ground structure comprises at least one of first ground portions connected to the tie bars, and/or at least one of second ground portions connected to the die pad, and wherein the first ground portions are separate from each other and the second ground portions are separate from each other; at least one chip mounted on the die pad and electrically connected to the leads and the ground structure; and an encapsulation body for encapsulating the chip and the lead frame.

The first ground portions and the second ground portions are not interconnected. The first ground portions are formed on both lateral sides of each tie bar of the lead frame, and each side edge of the die pad is formed with at least one of the second ground portions. Moreover, the first ground portions can be coupled to or not in connection to the die pad. In the case of the first ground portion is connected with the die pad, it comprises a ground area and a connection area which are interconnected to form a hollow-out area together with the corresponding tie bar. If the first ground portion is not in connection to the die pad, it merely comprises a ground area shaped as a strip. Furthermore, the second ground portion comprises a ground area and a connection area which are interconnected to form a hollow-out areas together with the corresponding side edge of the die pad.

Therefore, in the use of the above ground-enhanced semiconductor package and lead frame proposed by the present invention, as the ground portions arranged on the lateral sides of the tie bars or on the side edges of the die pad are not interconnected, thermal stresses generated under a high temperature condition can be desirably released through the ground portions without causing deformation thereof thereby assuring the grounding performance.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
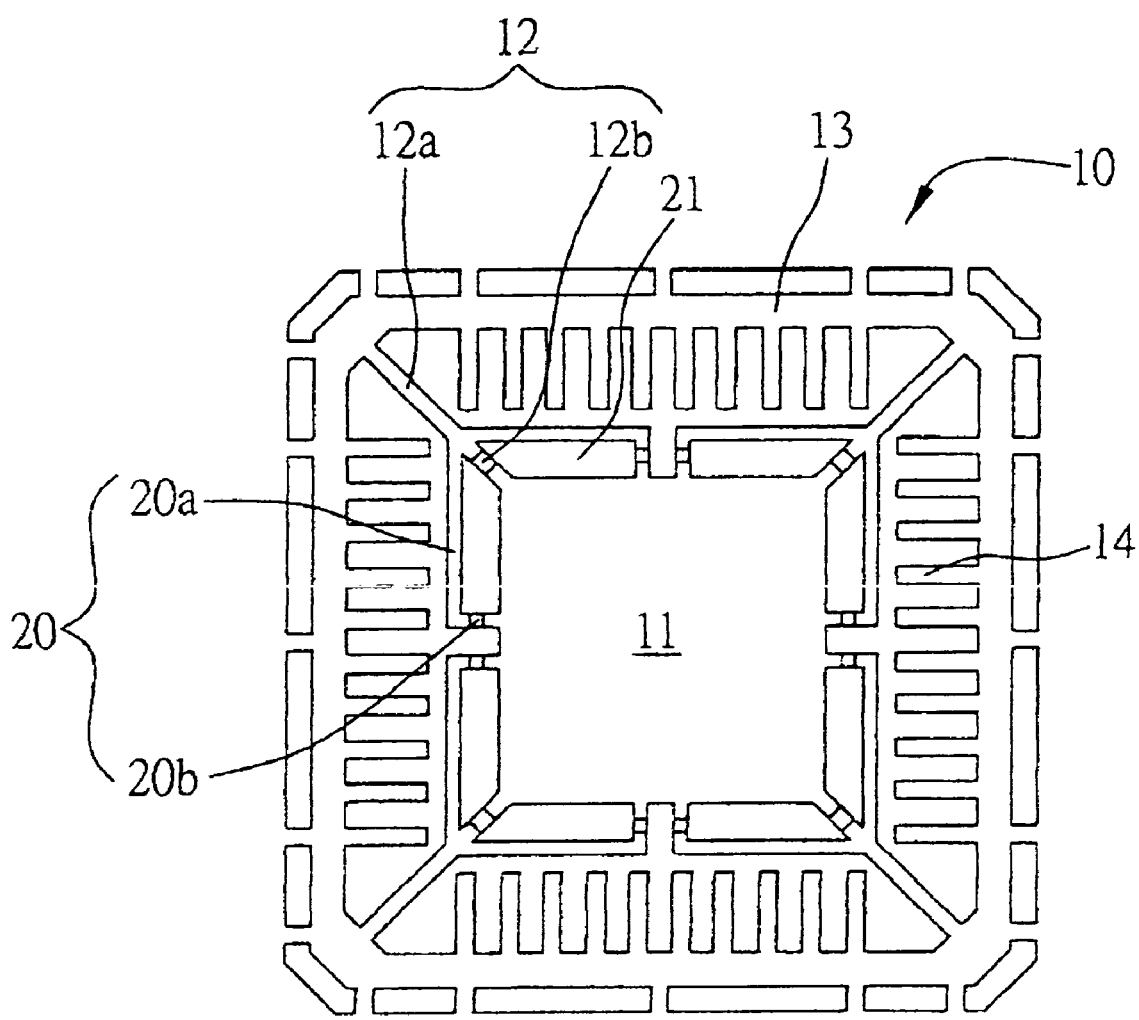
FIG. 1 is a top view of a lead frame according to a first preferred embodiment of the invention.

As shown in FIG. 1, a lead frame 10, according to a first preferred embodiment of the present invention, is made of copper or copper alloy and integrally formed with a square die pad 11, four tie bars 12 connected to four corners of the square die pad 11, a square connection frame 13 linked to the four tie bars 12, and a plurality of leads 14 extending from the connection frame 13 and situated around the die pad 11. A ground structure is disposed around the die pad 11 of the lead frame 10 to provide ground areas for a chip (not shown) mounted on the die pad 11. In this embodiment, the ground structure includes four groups of first ground portions 20 integrally connected to the tie bars 12. Each group of the first ground portions 20 is formed on both lateral sides of each of the tie bars 12 and also connected to the die pad 11. The first ground portions 20 are not connected with each other so as to eliminate thermal deformation of the first ground portions 20 and allow thermal stresses to be released through the first ground portions 20.

Figure 3A:
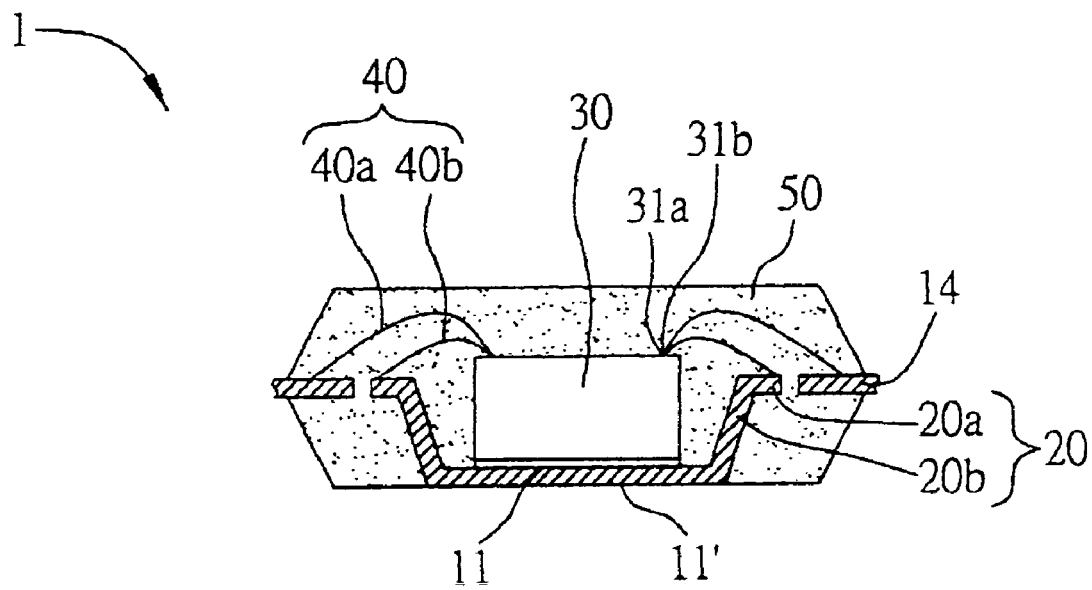
FIG. 3A is a cross-sectional view of a semiconductor package having the lead frame taken along the line 3A—3A of FIG. 2.

Moreover, as shown in FIG. 3A, the die pad 11 is downset in position relative to the leads 14 by a height difference. Each of the four tie bars 12 comprises a first tie bar 12a extending from the connection frames 13, and a second tie bar 12b positioned between the first ground portions 20 and the die pad 11. The first tie bar 12a are coplanar with the leads 14, while the second tie bar 12b is tilted to comply with the height difference between the die pad 11 and the leads 14.

Figure 2:
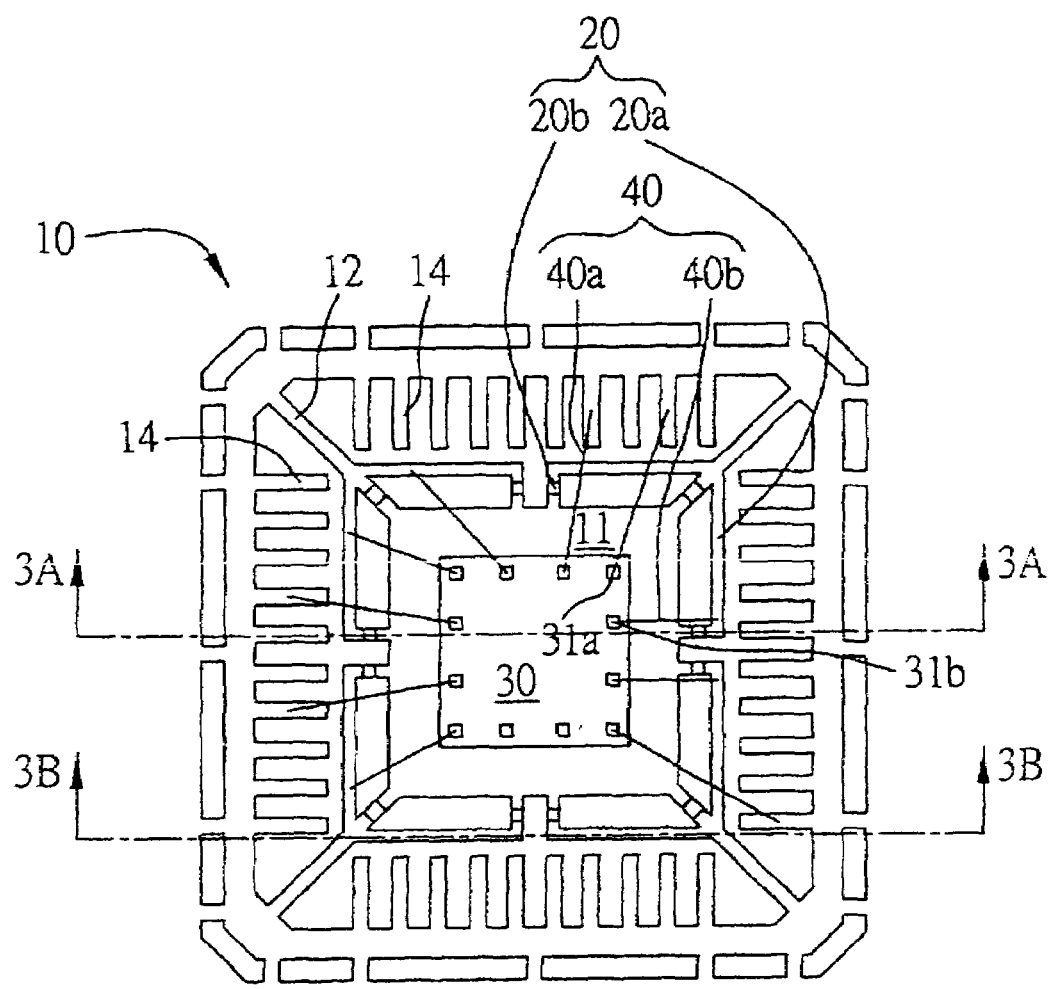
FIG. 2 is a top view showing the lead frame in FIG. 1 mounted with a chip thereon.

The first ground portions 20 are integrally fabricated when the lead frame 10 is subject to a stamping process, and arranged on both lateral sides of each of the tie bars 12 to form hollow-out areas 21 each of which is bordered by the corresponding first ground portion 20, the corresponding tie bar 12 and a side edge of the die pad 11. Each first ground portion 20 comprises a ground area 20a and a connection area 20b which are interconnected, wherein the ground area 20a and the connection area 20b are respectively connected to the tie bars 12 and the die pad 11. As shown in FIG. 3A, the ground area 20a of the first ground portion 20 are coplanar with the leads 14, while the connection area 20b is tilted in accordance with the height difference between the die pad 11 and the leads 14. As shown in FIG. 2, the lead frame 10 is readily mounted with a chip 30 on the die pad 11 and formed with a plurality of bonding wires 40 which electrically connect the chip 30 to the lead frame in a manner that, a plurality of signal wires 40a are used for connection between signal pads 31a on the chip 30 and the leads 14, and a plurality of ground wires 40b are used for connection between ground pads 31b on the chip 30 and the horizontal ground areas 20a of the first ground portions 20.

Figure 3B:
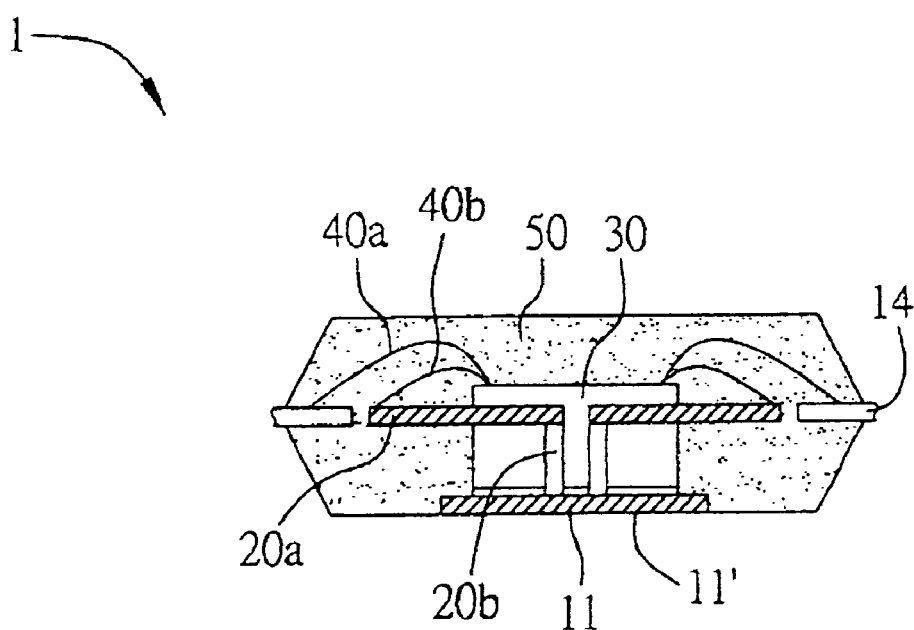
FIG. 3B is a cross-sectional view of a semiconductor package having the lead frame taken along the line 3B—3B of FIG. 2.

Consequently, the above die-bonded and wire-bonded lead frame 10 is subject to formation of an encapsulation body 50 which encapsulates the chip 30 and bonding wires 40 with the plurality of leads 14 being partly exposed outside, to thereby form a semiconductor package 1 shown in FIGS. 3A and 3B. FIG. Further, a bottom surface 11', opposite to the surface mounted with the chip 30, of the die pad 11 can be exposed to outside of the encapsulation body 50 to facilitate heat dissipation from the chip 30.

During high-temperature processes such as die bond curing, wire bonding, and molding for fabricating the semiconductor package 1, the lead frame 10 would be deformed by thermal stresses. Since the first ground portions 20 are not interconnected, they are not constrained by the presence of the tie bars 12 but can be thermally expanded from both lateral sides of the tie bars 12 to release the thermal stresses, thereby not causing undesirable deformation of the first ground portions 20, such that prior-art problems of difficult wire bonding and wire breaking can be avoided. Moreover, during stamping the lead frame 10, the non-interconnected first ground portions 20 would not retain excess residual stresses therein, thereby reducing the possibility to damage the structural integrity.

Figure 4A:
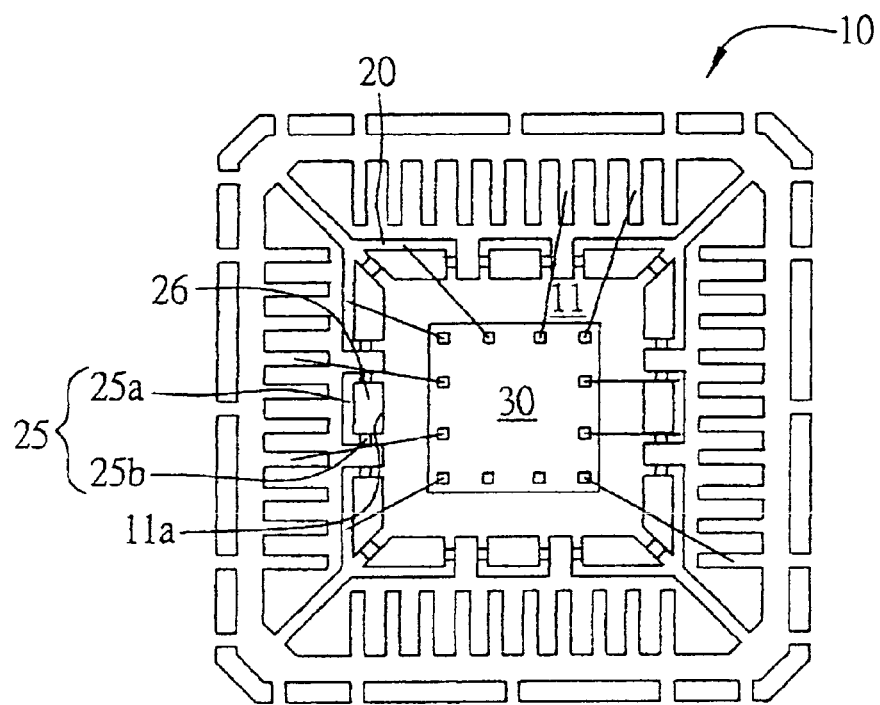
FIGS. 4A—4C are top views of the lead frame mounted with a chip thereon according to second, third and fourth preferred embodiments of the invention respectively.

FIG. 4A shows a lead frame 10 according to a second embodiment of the invention. As shown, this lead frame 10 is mostly the same in structure as that shown in FIG. 2 but differs in that, in addition to the first ground portions 20, at least one second ground portion 25 is formed and connected to each side edge 11a of the die pad 11, wherein the second ground portions 25 are not interconnected and not connected to the first ground portions 20. The second ground portion 25 comprises two connection areas 25b connected to the corresponding side edge 11a of the die pad 11, and a ground area 25a connected to the two connection areas 25b, such that the ground area 25a, the two connection areas 25b and the corresponding side edge 11a of the die pad 11 encompass to form a square hollow-out area 26. Similarly, the ground area 25a of the second ground portion 25 is coplanar with the leads 14, and the connection areas 25b are tilted to be accommodated to the height difference between the die pad 11 and the leads 14. Further, the ground areas 25a of the second ground portions 25 are coplanarly arranged with respect to the ground areas 20a of the first ground portions 20 to facilitate the performance of a subsequent wire-bonding process.

Figure 4B:
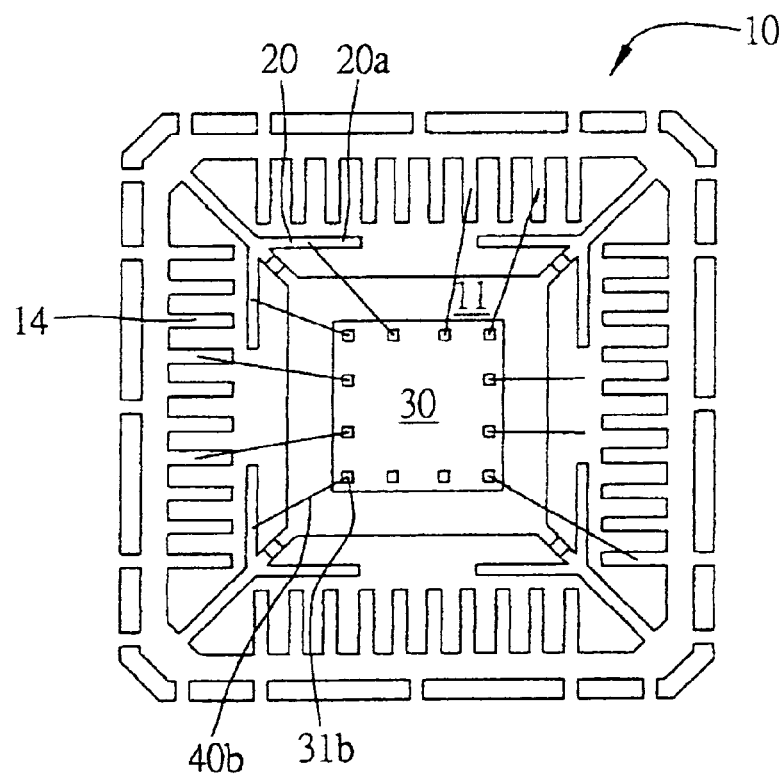

FIG. 4B shows a lead frame 10 according to a third embodiment of the invention. As shown, this lead frame 10 differs from that shown in FIG. 2 in the design of the first ground portions 20. In this embodiment, there is no connection area 20b (FIG. 2) formed for the first ground portions 20 which thereby are suspended and not connected to the die pad 11, while the ground areas 20a of the first ground portions 20 remain coplanar with the leads 14. As a result, the bond pads 31b on the chip 30 can be directly electrically connected to the horizontal ground areas 20a via the ground wires 40b. During a high-temperature process, the horizontal ground areas 20a of the first ground portions 20 according to this embodiment are provided with even larger space for accommodating the thermal expansion thereof and releasing the thermal stresses, such that deformation of the first ground portions 20 can be prevented without affecting the grounding performance.

Figure 4C:
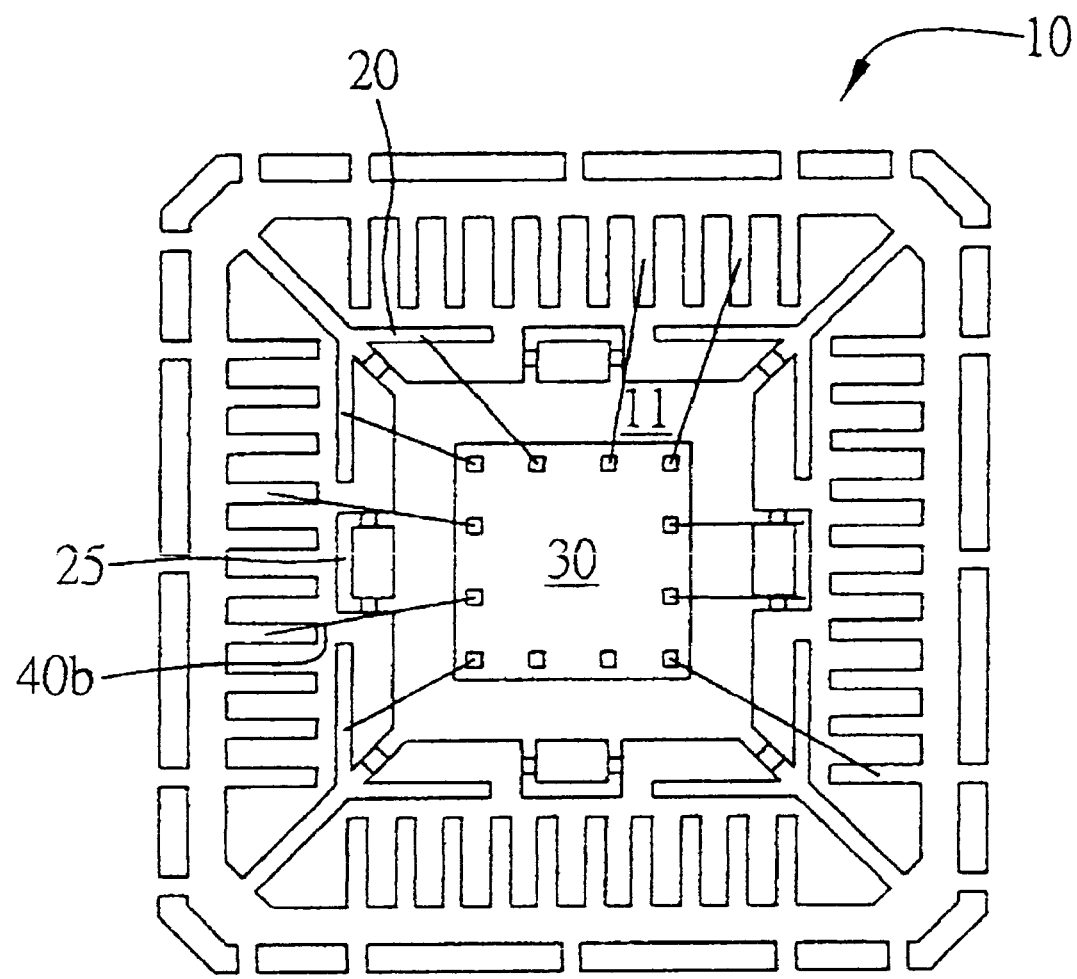
Figure 5A:
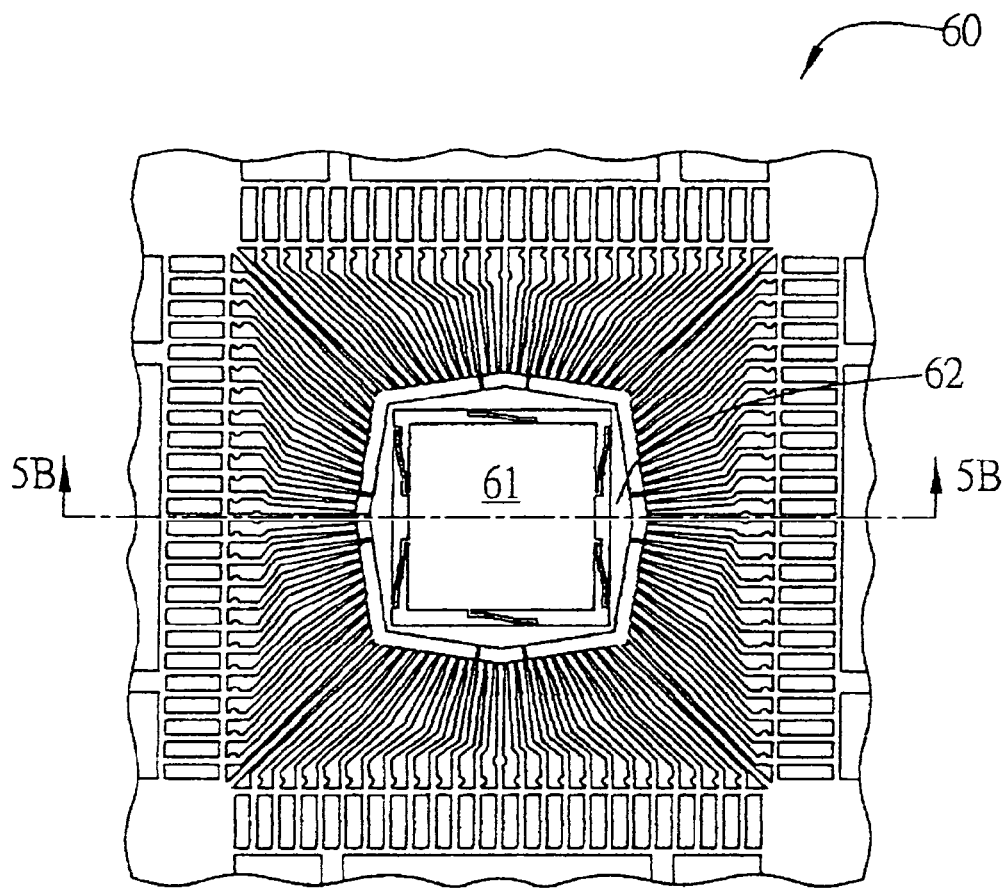
FIG. 5A is a top view of a lead frame disclosed in U.S. Pat. No. 5,814,877.
Figure 5B:
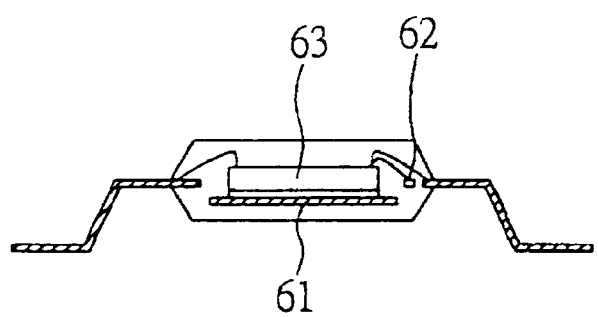
FIG. 5B is a cross-sectional view of a semiconductor package having the lead frame taken along the line 5B—5B of FIG. 5A.
Figure 6A:
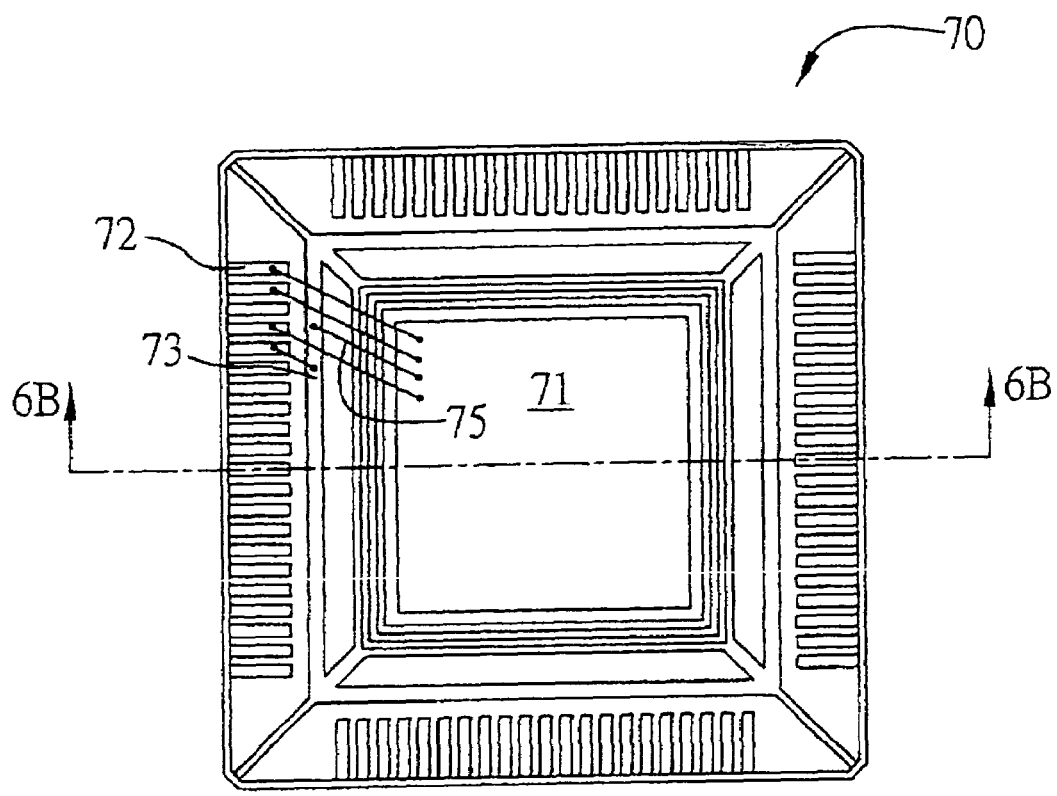
FIG. 6A is a top view of lead frame disclosed in U.S. Pat. No. 6,437,427.
Figure 6B:
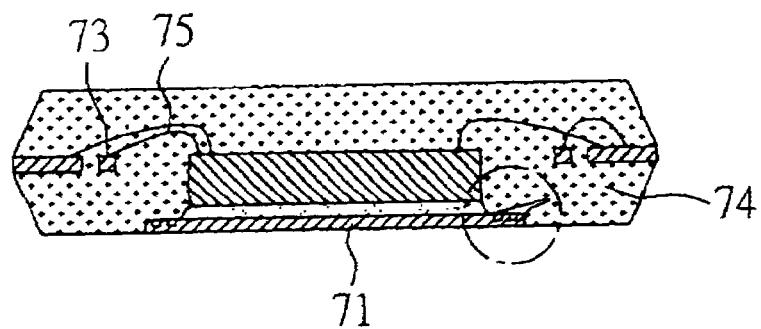
FIG. 6B is a cross-sectional view of a semiconductor package having the lead frame taken along the line 6B—6B of FIG. 6A.
Figure 7A:
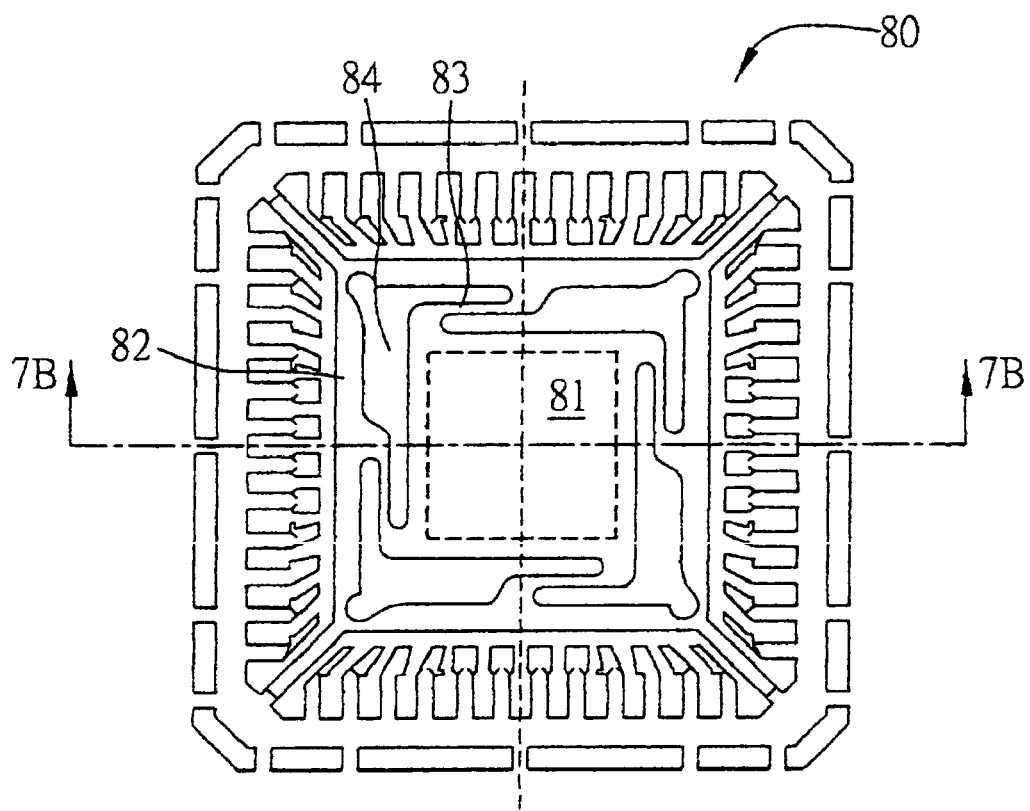
FIG. 7A is a top view of a lead frame disclosed in U.S. Pat. No. 6,380,048.
Figure 7B:
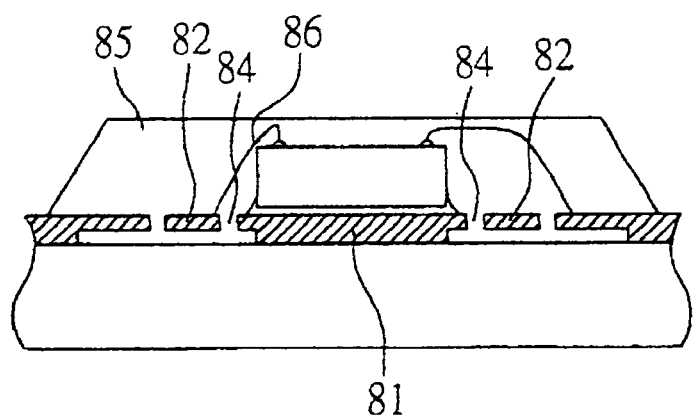
FIG. 7B is a cross-sectional view of a semiconductor package having the lead frame taken along the line 7B—7B of FIG. 7A.
Figure 8A:
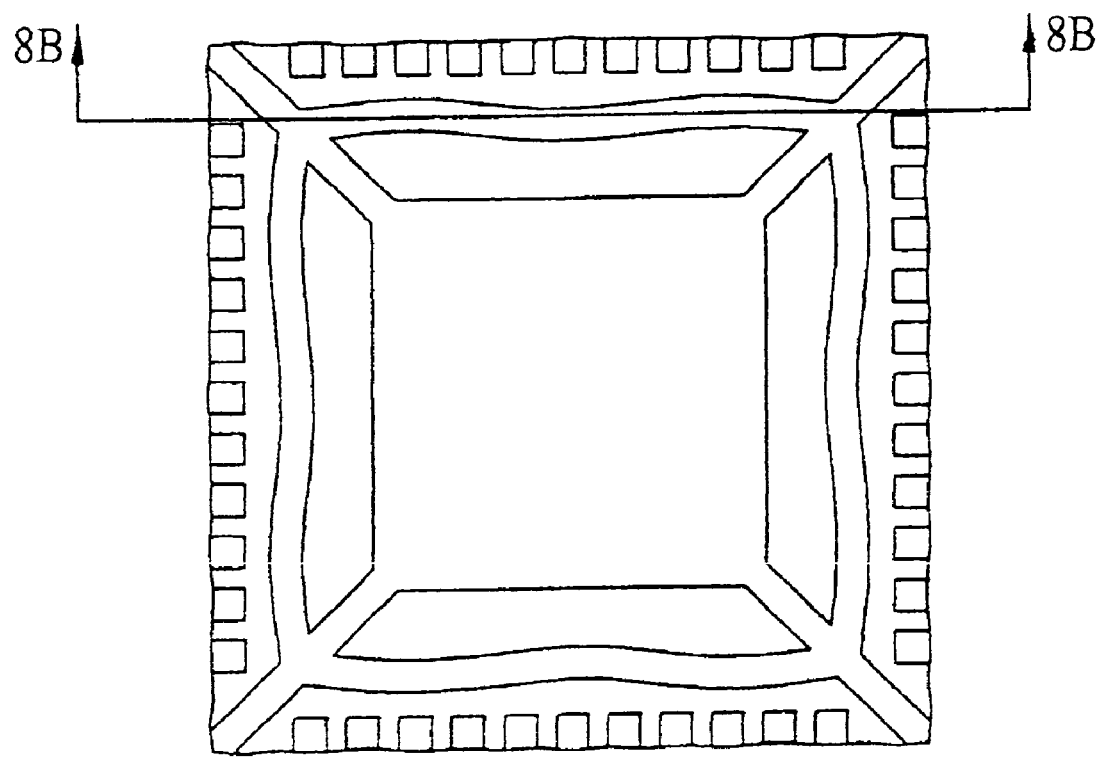
FIG. 8A is a top view of a conventional ground ring deformed by a high temperature.
Figure 8B:
FIG. 8B is a cross-sectional view taken along the line 8B—8B of FIG. 8A.
Figure 9A:
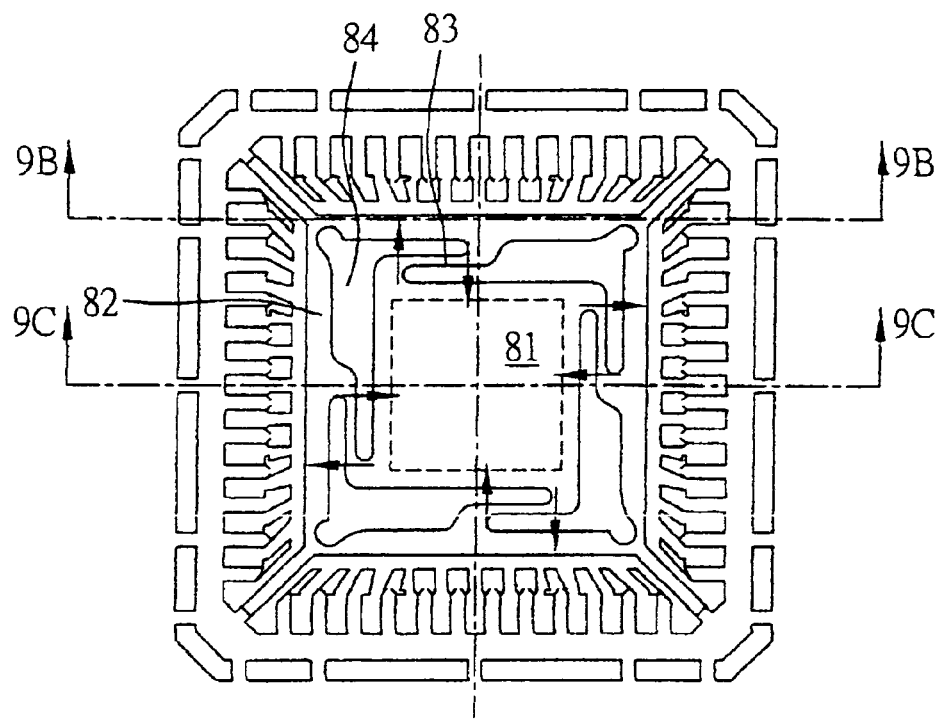
FIG. 9A is a to n view showing stress release from S-shaped tie bars of the lead frame in FIG. 7A.
Figure 9B:
FIG. 9B is a cross-sectional view showing deformation of a ground ring of the lead frame taken along the line 9B—9B of FIG. 9A.
Figure 9C:
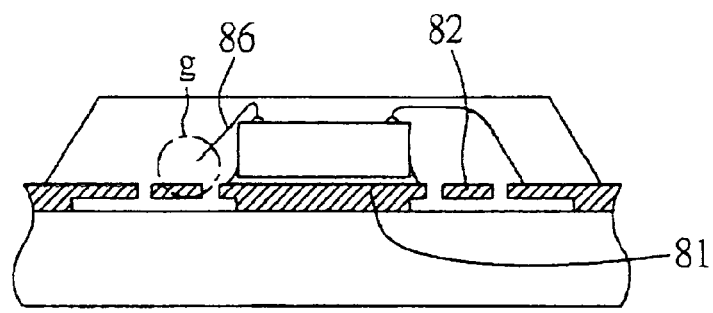
FIG. 9C is a cross-sectional view of a semiconductor package having the lead frame taken along the line 9C—9C of FIG. 9A.

In a fourth embodiment of the invention as shown in FIG. 4C, a lead frame 10 is made by having the one from the third embodiment of FIG. 4B additionally formed with the second ground portions 25 according to the second embodiment of FIG. 4A. The second ground portions 25 are structured the same as those in FIG. 4A for being bonded with more ground wires 40b to enhance the grounding performance.

Therefore, in the use of the above semiconductor package 1 and lead frame 10, the non-interconnected first ground portions 20 and/or second ground portions 25 can be effectively used to release thermal stresses without leading to undesirable deformation thereof. It should be understood that, the design of the first and second ground portions 20, 25 is not restricted to the aforementioned four embodiments, while other modifications are also permitted for example, using the second ground portions 25 only with no first ground portion 20 present. Further, the ground areas 20a, 25a of the first and second ground portions 20, 25 can be flexibly positioned with respect to the leads 14, but not limited to the coplanar arrangement, according to the practical requirements; for example, the first tie bars 12a may be inclined to position the ground areas 20a, 25a to be downset relative to the leads 14.

In conclusion from the above, the ground-enhanced semiconductor package and the lead frame proposed by the present invention can desirable prevent deformation of ground areas or ground structure thereof under a high temperature condition, thereby not leading to prior-art problems such as difficult wire bonding and wire breaking. Moreover, the ground portions integrally formed with the lead frame are designed to reduce residual stresses therein during fabrication, thereby preventing stress-induced structural damages and assuring the structural integrity.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A ground-enhanced semiconductor package, comprising:
   a lead frame having at least one die pad, a plurality of tie bars connected with and supporting the die pad, a plurality of leads surrounding the die pad, and a plurality of ground structures surrounding the die pad;
   wherein the ground structures are separated from each other and each of the ground structures comprises at least one of first ground portions directly connected to the tie bars so as to prevent deformation of the ground structure to assure grounding performance of the semiconductor package, wherein the first ground portions are separate from each other and are connected to both lateral sides of the tie bars, and a hollow-out area is formed between the first ground portions;
   at least one chip mounted on the die pad and electrically connected to the leads and the first ground portion of the ground structure by bonding wires; and
   an encapsulation body for encapsulating the chip and the lead frame.

2. The ground-enhanced semiconductor package of claim 1, further comprising at least one of second ground portions connected to the die pad, wherein the second ground portions are separate from each other and from the first ground portions.

3. The ground-enhanced semiconductor package of claim 2, wherein the second ground portion comprises a ground area and at least one connection area which are interconnected to form a hollow-out area together with a side edge of the die pad.

4. The ground-enhanced semiconductor package of claim 2, wherein each side edge of the die pad is formed with at least one of the second ground portions.

5. The ground-enhanced semiconductor package of claim 1, wherein the first ground portion is connected to the die pad.

6. The ground-enhanced semiconductor package of claim 5, wherein the first ground portion comprises a ground area and a connection area which are interconnected to form the hollow-out area together with one of the tie bars.

7. The ground-enhanced semiconductor package of claim 1, wherein the first ground portion is not connected to the die pad.

8. The ground-enhanced semiconductor package of claim 7, wherein the first ground portion is shaped as a strip.

9. The ground-enhanced semiconductor package of claim 1, wherein each of the tie bars is formed with at least one of the first ground portions.

10. A lead frame for a semiconductor package, comprising:
a body having at least one die pad, a plurality of tie bars connected with and supporting the die pad, and a plurality of leads surrounding the die pad; and
a plurality of ground structures surrounding the die pad, wherein the ground structures are separated from each other and each of the ground structures comprises at least one of first ground portions directly connected to the tie bars so as to prevent deformation of the ground structure to assure grounding performance of the semiconductor package, wherein the first ground portions are separate from each other and are connected to both lateral sides of the tie bars, and a hollow-out area is formed between the first ground portions.

11. The lead frame of claim 10, further comprising at least one of second ground portions connected to the die pad, wherein the second ground portions are separate from each other and from the first ground portions.

12. The lead frame of claim 11, wherein the second ground portion comprises a ground area and at least one connection area which are interconnected to form a hollow-out area together with a side edge of the die pad.

13. The lead frame of claim 11, wherein each side edge of the die pad is formed with at least one of the second ground portions.

14. The lead frame of claim 10, wherein the first ground portion is connected to the die pad.

15. The lead frame of claim 14, wherein the first ground portion comprises a ground area and a connection area which are interconnected to form the hollow-out area together with one of the tie bars.

16. The lead frame of claim 14, wherein the first ground portion is not connected to the die pad.

17. The lead frame of claim 16, wherein the first ground portion is shaped as a strip.

18. The lead frame of claim 10, wherein each of the tie bars is formed with at least one of the first ground portions.

* * * * *